(12) United States Patent
Kim et al.

(10) Patent No.: US 7,111,629 B2
(45) Date of Patent: Sep. 26, 2006

(54) METHOD FOR CLEANING SUBSTRATE SURFACE

(75) Inventors: Jeong-Ho Kim, Suugnam-shi (KR); Gil-Gwang Lee, Kwangmyung-shi (KR)

(73) Assignee: APL Co., Ltd., (KR)

( * ) Notice: Subject to any disclaimer, the term of this patent is extended or adjusted under 35 U.S.C. 154(b) by 0 days.

(21) Appl. No.: 10/850,261

(22) Filed: May 20, 2004

(65) Prior Publication Data

US 2005/0014375 A1 Jan. 20, 2005

Related U.S. Application Data

(60) Continuation-in-part of application No. 10/831,252, filed on Apr. 23, 2004, which is a division of application No. 10/038,553, filed on Jan. 4, 2002, now abandoned.

(30) Foreign Application Priority Data

| Jan. 8, 2001 | (KR) | ................................. 2001-1018 |
| Dec. 14, 2001 | (KR) | ............................. 2001-79425 |

(51) Int. Cl.
*B08B 6/00* (2006.01)

(52) U.S. Cl. ........................... 134/1.2; 134/26; 134/30; 216/67; 216/68; 216/69; 216/74; 216/76; 216/79; 438/906; 438/710

(58) Field of Classification Search ................. 134/1.2, 134/26, 30; 216/67, 68, 69, 74, 76, 79; 438/710, 438/906
See application file for complete search history.

(56) References Cited

U.S. PATENT DOCUMENTS

| 3,923,559 | A | * | 12/1975 | Sinha | ........................... 438/12 |
| 4,828,369 | A | * | 5/1989 | Hotomi | ....................... 359/270 |
| 5,192,717 | A | * | 3/1993 | Kawakami et al. | ......... 438/479 |
| 5,217,501 | A | * | 6/1993 | Fuse et al. | .................. 29/25.01 |
| 5,284,544 | A | * | 2/1994 | Mizutani et al. | ........ 156/345.38 |
| 5,403,434 | A | | 4/1995 | Moslehi | ....................... 134/1.2 |
| 6,055,927 | A | * | 5/2000 | Shang et al. | ......... 118/723 ME |
| 6,342,436 | B1 | * | 1/2002 | Takizawa | ..................... 438/473 |
| 6,352,049 | B1 | * | 3/2002 | Yin et al. | ............. 118/723 MP |
| 6,410,991 | B1 | | 6/2002 | Kawai et al. | ................ 257/392 |
| 6,544,900 | B1 | | 4/2003 | Raaijmakers et al. | ........ 438/769 |
| 6,629,538 | B1 | * | 10/2003 | Yokogawa et al. | .......... 134/1.2 |
| 6,905,965 | B1 | * | 6/2005 | Subrahmanyan et al. | ... 438/687 |
| 2005/0079717 | A1 | * | 4/2005 | Savas et al. | ................ 438/689 |

FOREIGN PATENT DOCUMENTS

JP 1131599 5/1989

(Continued)

*Primary Examiner*—M. Kornakov
(74) *Attorney, Agent, or Firm*—Hayes Soloway P.C.

(57) ABSTRACT

There is provided a surface cleaning apparatus and method using plasma to remove a native oxide layer, a chemical oxide layer, and a damaged portion from a silicon substrate surface, and contaminants from a metal surface. A mixture of $H_2$ and $N_2$ gas is used as a first processing gas. By absorbing potential in a grounded grid or baffle between a plasma generator and a substrate, only radicals are passed to the substrate, and HF gas is used as a second processing gas. Thus a native oxide layer, a chemical oxide layer, or a damaged portion formed on the silicon substrate during etching is removed in annealing step with $H_2$ flow. The environment of a chamber is maintained constant by introducing a conditioning gas after each wafer process. Therefore, process repeatability is improved.

4 Claims, 11 Drawing Sheets

FOREIGN PATENT DOCUMENTS

| | | |
|---|---|---|
| JP | 6231124 | 8/1994 |
| JP | 8064390 | 3/1996 |
| JP | 8162427 | 6/1996 |
| JP | 10172957 | 6/1998 |
| JP | 10-335316 | 12/1998 |
| JP | 11106929 | 4/1999 |
| JP | 2000236021 | 8/2000 |
| KR | P2003-0049261 | 6/2003 |
| KR | 10-0404956 | 11/2003 |

* cited by examiner

PRIOR ART

PRIOR ART

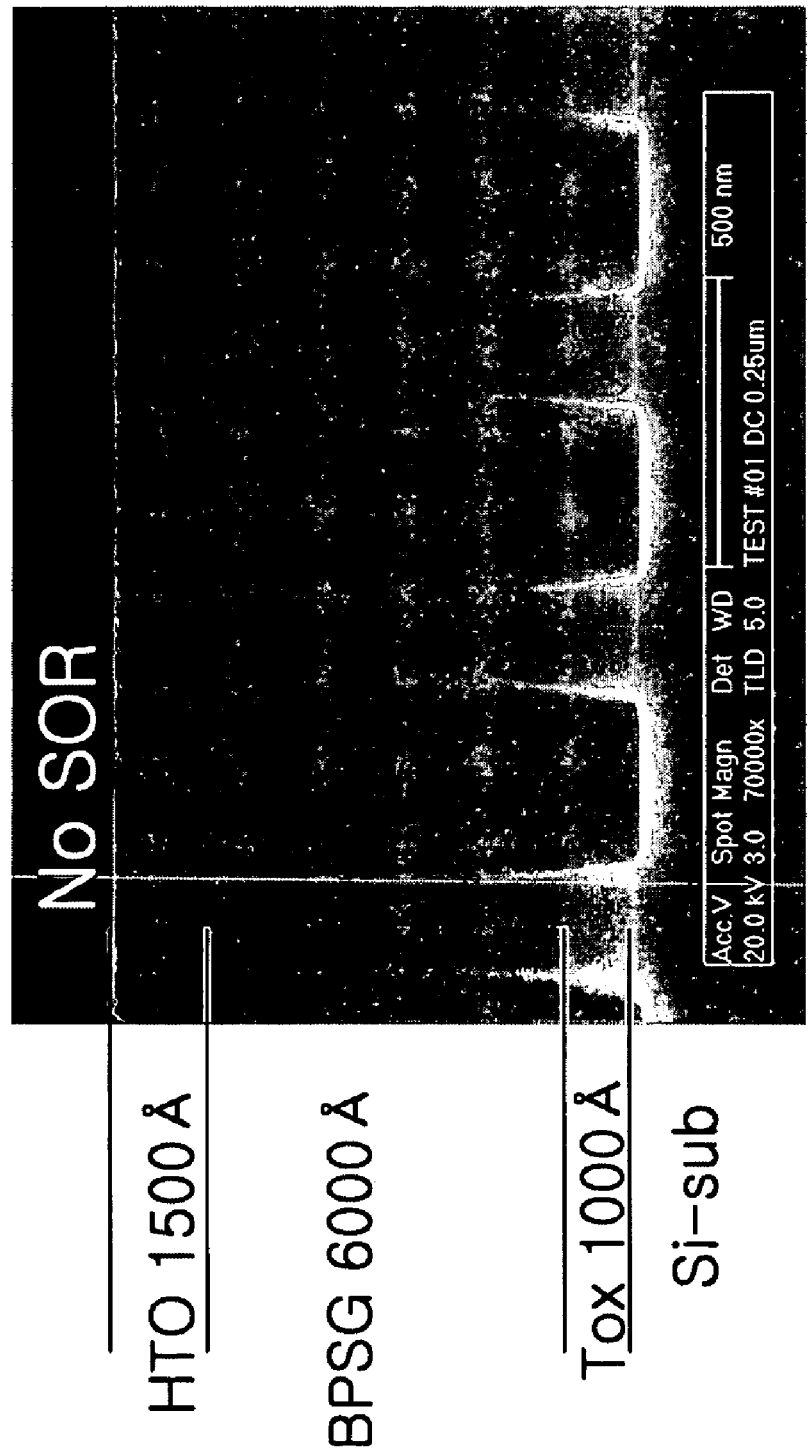

METHOD FOR CLEANING SUBSTRATE SURFACE

CROSS REFERENCE TO RELATED APPLICATION

This application is a continuation-in-part of U.S. application Ser. No. 10/831,252, filed Apr. 23, 2004 which is, in turn, a divisional of U.S. application Ser. No. 10/038,553, filed Jan. 4, 2002 now abandoned.

PRIORITY

This application claims priority to an application entitled Method of Manufacturing Semiconductor Integrated Circuit and Apparatus Thereof filed in the Korean Industrial Property Office on Jan. 8, 2001 and assigned Serial No. 2001-1018, and to an application entitled Apparatus and Method for Dry Surface Cleaning Using Plasma filed in the Korean Industrial Property Office on Dec. 14, 2001 and assigned Serial No. 2001-79425, the contents of both of which are hereby incorporated by reference.

BACKGROUND OF THE INVENTION

1. Field of the Invention

The present invention relates generally to a surface cleaning apparatus and method using plasma, and in particular, to a surface cleaning apparatus and method for, using plasma, removing a native oxide layer resulting from reaction between oxygen in the air and a silicon, silicide or metal surface in fabrication of an integrated circuit such as semiconductor device or TFT (Thin Film Transistor) LCD (Liquid Crystal Display), an oxide layer chemically formed on the silicon surface during processing, a damaged portion on the silicon surface, or contaminants on the silicon surface and the sidewalls of a contact hole.

2. Description of the Related Art

In general, metalization is needed to connect devices formed on an underlying silicon substrate by a metal layer in fabrication of an integrated circuit such as a semiconductor, TFT LCD, or FPD (Flat Panel Display). Formation of a contact hole is requisite for the metalization. The contact hole is formed usually by dry-etching an oxide layer using plasma. In the course of forming the contact hole, the underlying silicon, silicide or metal surface is exposed. After the dry etch, a damaged portion is formed due to ion impact from the plasma, and contaminants including materials dissociated from etching gases and etched materials stick to a silicon surface and sidewalls. Because the damaged portion and contaminants may increase contact resistance or leakage current that is deadly adverse to device characteristics, they are removed by dry cleaning or wet cleaning during fabrication of an integrated circuit. Aside from the damaged portion and contaminants, a native oxide layer is formed due to reaction between oxygen in the air and the silicon, silicide or metal surface. Therefore, the native oxide layer should also be removed by dry cleaning or wet cleaning before deposition of a conductive material after the contact hole is formed.

In addition, an oxide layer can be chemically formed by reaction between the silicon surface and a mixed solution of $H_2O_2$, $H_2SO_4$, and deionized water used for post-etch processing. The oxide layer influences subsequent steps and deteriorates electrical connection characteristics, thereby degrading the characteristics of a resulting semiconductor or TFT LCD circuit.

Along with the decrease of CD(Critical Dimension) in an integrated circuit, a self-aligned contact (SAC) has recently been used widely. During an SAC etch, an etch stopper layer made of a silicon nitride layer is exposed. Thus, either sidewalls formed of a silicon oxide layer or the nitride layer should not be etched during surface cleaning in order to prevent short between an electrode surrounded by the nitride film and a conductive material filling the contact hole as well as minimizing leakage current.

Even if the silicon substrate surface underlying the contact hole is not closed, a gate, a polysilicon electrode for a capacitor, or a connection line can be exposed. In this case, a damaged portion, an oxide layer, or contaminants should be removed as in the case where the silicon substrate surface is exposed.

A metal is used for a gate electrode or bit lines of a memory when necessary. The top portion of the metal is exposed during etching a contact hole. Similarly, contaminants on the metal and sidewalls must be removed and much attention should be paid to the removal because etched metal components are contained in the contaminants and are difficult to remove.

FIG. 1 is a schematic view of a conventional fluorine acid spray apparatus. Referring to FIG. 1, the conventional fluorine acid spray apparatus is comprised of a fluorine acid solution 10, a heating chamber 20, a substrate 30, a substrate mount 40, a fluorine solution tank 50 filled with a fluorine acid solution 60, and fluorine acid supply pipes 70 and 80. To prevent formation of a native oxide layer, oxygen is preliminarily removed by forming a fluorine layer on a silicon surface to react with the oxygen. Specifically, a fluorine acid layer is formed on a silicon surface by generating fluorine acid vapor using the fluorine acid spray apparatus and hardened by heat. Oxygen introduced into an etching device to etch the fluorine acid layer-having substrate or oxygen remaining in the etching device reacts chemically with the fluorine acid layer on the surface of the substrate and thus the oxygen is removed.

Despite the advantage of simplicity in device configuration and concept, however, the above conventional technology has a shortcoming in that it is difficult to effectively control fine process parameters.

UV (UltraViolet) light and ozone ($O_3$) can be used for surface cleaning. That is, a silicon surface is oxidized by reaction between silicon and $O_3$ dissociated by UV light and the oxide layer is removed by wet etch. However, oxidation takes a long time, leading to slow processing accurately.

FIG. 2 is a schematic view of a conventional plasma etching apparatus. plasma is generated in a plasma generator 100 by introducing $H_2$ and $N_2$ through a first processing gas inlet 90 and then $NF_3$ is introduced through a second processing gas inlet 110, thereby etching a silicon substrate 120 in a chamber 140 with gases exhausted through an outlet 130.

The $NF_3$ gas as a main processing gas accelerates plasma dissociation and activation, so that excess fluorine atoms and ions involved in the etching are generated. As a result, the silicon surface is over-etched deeper than a damaged portion, or a BPSG (Borophosphosilicate glass) oxide layer or a nitride layer that must avoid etching may also be etched. This is due to a a low selection ratio between native oxide etch rate and etch rate of silicon, BPSG or nitride when $NF_3$ is used.

Another feature in which an inert gas such as Ar as a first processing gas shows a slow etch rate.

Therefore, it is required to provide improved cleaning method other than a conventional wet or dry etching method as described above.

SUMMARY OF THE INVENTION

It is, therefore, an object of the present invention to provide a surface cleaning apparatus and method using plasma, for removing a native oxide layer or a chemical oxide layer formed on a silicon surface before growth of a gate oxide layer for the purpose of preventing deterioration of the characteristics of the gate oxide layer.

It is also an object of the present invention to provide a surface cleaning apparatus and method using plasma, for removing a native oxide layer/a chemical oxide layer, a damaged portion, and contaminants from a silicon surface exposed during etching an oxide layer before salicidation (CoSi or NiSi formation) in order to prevent the increase of contact resistance and leakage current.

It is also an object of the present invention to provide a surface cleaning apparatus and method using plasma, for removing a native oxide layer/a chemical oxide layer, a damaged portion, and contaminants from a silicon surface exposed during etching an oxide layer for formation of a contact hole in order to prevent the increase of contact resistance and leakage current.

It is also an object of the present invention to provide a surface cleaning apparatus and method using plasma, for removing a native oxide layer and contaminants from a silicide surface exposed during etching a oxide layer for formation of a contact hole in order to prevent the increase of contact resistance and leakage current.

It is also an object of the present invention to provide a surface cleaning apparatus and method using plasma, for removing contaminants such as polymers on the sidewalls of a contact hole and the upper surface of an underlying metal layer when the contact hole is etched for connection to the metal layer.

It is also an object of the present invention to provide a surface cleaning apparatus and method using plasma, for removing a native oxide layer/a chemical oxide layer, a damaged portion, and contaminants from an etched silicon surface before the formation of STI (shallow trench insulation) in order to prevent the increase of leakage current.

It is a further object of the present invention to provide a surface cleaning apparatus and method using plasma, for growing good quality epitaxial silicon by removing a native oxide layer or a chemical oxide layer from a silicon surface prior to the epitaxial silicon growing process in fabrication of an integrated circuit.

It is still another object of the present invention to provide a surface cleaning apparatus and method using plasma, for growing good quality hemispherical grains (HSGs) by removing a native oxide layer or a chemical oxide layer from an underlying silicon surface in an HSG silicon formation process.

It is yet another object of the present invention to provide a surface cleaning apparatus and method using plasma, for improving process uniformity.

The foregoing and other objects of the present invention can be achieved by providing a surface cleaning apparatus and method using plasma. According to one aspect of the present invention, the surface cleaning apparatus using plasma has a chamber that can be maintained in a vacuum state, a substrate mount in the chamber, for mounting a silicon substrate, a first processing gas inlet for introducing a carrier gas into the chamber to generate and maintain plasma, a plasma generator for forming plasma out of the first processing gas, a filter between the plasma generator and the substrate mount, for passing only radicals to the substrate, and a second processing gas inlet between the plasma generator and the filter, for introducing a second processing gas into the chamber.

Preferably, the plasma generator uses a microwave generator as an energy source for plasma generation.

Preferably, a wall heat jacket is also provided for maintaining the walls of the chamber at a predetermined temperature to concentrate the radicals on the surface of the substrate to achieve a high etch rate by preventing deposition of the radicals and formation of a byproduct layer with the radicals. Particularly, chamber wall temperature between 50° C. and 120° C. makes surface cleaning speed 2–3 times more than normal cleaning environments.

Preferably, the filter is grounded, or a grid or baffle with a square-wave or sine-wave AC (alternating current) voltage applied is used as the filter.

More preferably, a third processing gas inlet is further provided for introducing a conditioning gas into the chamber to maintain a constant and controlled environment of the chamber after processing each wafer.

According to another aspect of the present invention, in the surface cleaning method using plasma, for removing a damaged portion and an unwanted oxide layer formed during etching for a contact hole on a silicon substrate having at least one layer including an insulation layer, a polymer layer is first formed on the oxide layer. The polymer layer and the oxide layer are removed by annealing wherein the components of the polymer layer are decomposed and combined with the components of the oxide layer and excited and removed, and the damaged portion of the surface of the silicon substrate is removed.

Preferably, in the polymer layer formation step, plasma is formed by introducing a first processing gas containing $H_2$ and $N_2$, only radicals are passed to the silicon substrate by filtering the plasma, and a second processing gas containing a halogen element is introduced.

Preferably, the second processing gas is HF.

Preferably, the polymer layer and the oxide layer are removed by annealing using a UV lamp or IR lamp, or by annealing in a heat chamber.

Preferably, the annealing gas is $H_2$. Flow of $H_2$ during annealing reduces time to remove the polymer layer and the oxide layer and at the same time passivates the surface of silicon, silicide or metal with hydrogen bonds, which extends the allowable time period prior to subsequent step. Preferable flow rate of $H_2$ is 10 sccm and 5,000 sccm.

Preferably, the damaged portion of the silicon substrate surface is removed by annealing in a heat chamber.

More preferably, the damaged portion removal step is performed in-situ in the same chamber as the polymer layer and the oxide layer are removed.

According to a further aspect of the present invention, in the surface cleaning method using plasma for fabrication of an integrated circuit in a surface cleaning apparatus having a chamber that can be maintained in a vacuum state, a substrate mount for mounting a silicon substrate, a first processing gas inlet for introducing a carrier gas for generation and maintenance of plasma, a plasma generator, a filter for passing only radicals to the substrate, and a second processing gas inlet, the first processing gas is introduced into the chamber, plasma is formed out of the first processing gas in the plasma generator, a second processing gas is introduced into the chamber, and then a third processing gas is introduced into the chamber to maintain the environment of the chamber constant after processing each wafer.

Preferably, the first processing gas contains $H_2$ and $N_2$.

Preferably, the filter is grounded or receives an AC voltage.

Preferably, the second processing gas contains a halogen element.

More preferably, the second processing gas is HF.

Preferably, the third processing gas contains at least one of H, F, O and N containing gas.

Preferably, the annealing gas is at least one of $H_2$, $N_2$ or Ar.

BRIEF DESCRIPTION OF THE DRAWINGS

The above and other objects, features and advantages of the present invention will become more apparent from the following detailed description when taken in conjunction with the accompanying drawings in which:

FIGS. 6A and 6B are SEM (Scanning Electro Microscope) images illustrating contact profiles.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
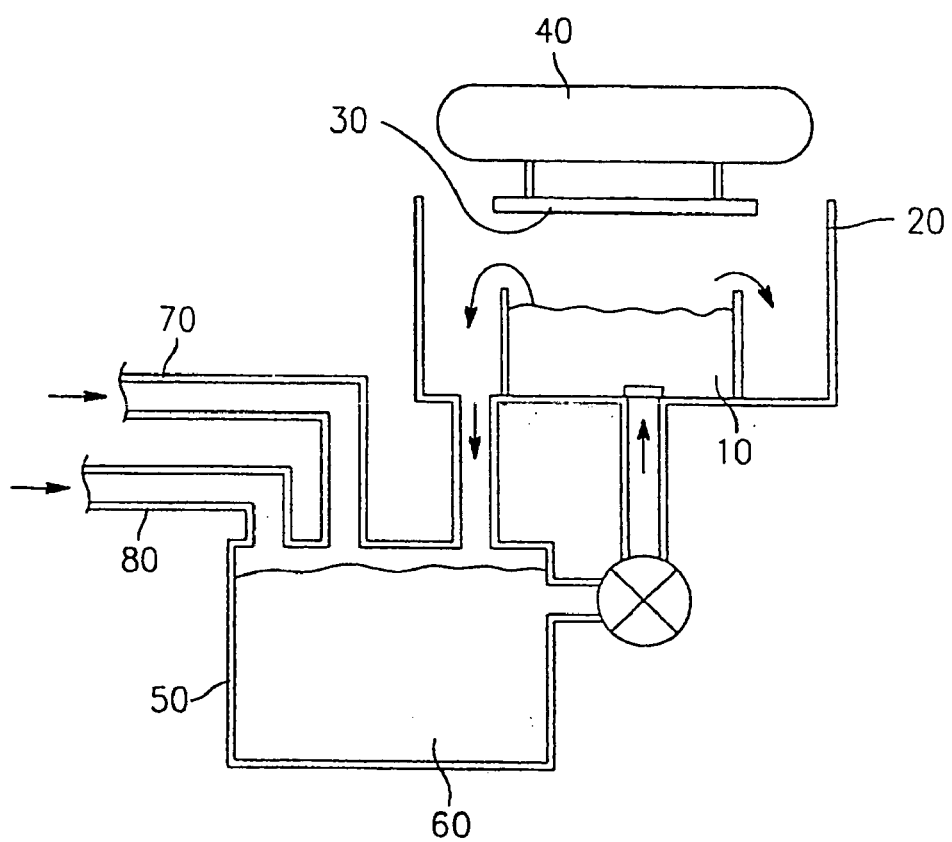
FIG. 1 is a schematic view of a conventional fluorine acid spray device.
Figure 2:
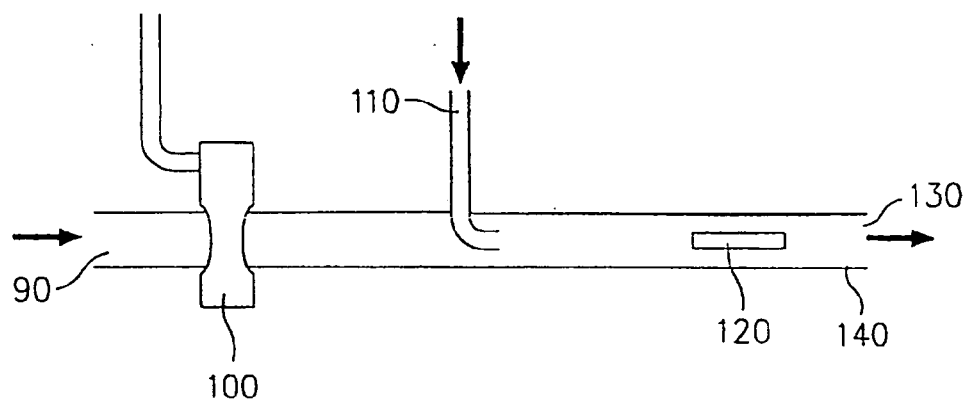
FIG. 2 is a schematic view of a conventional plasma etching apparatus.
Figure 3:
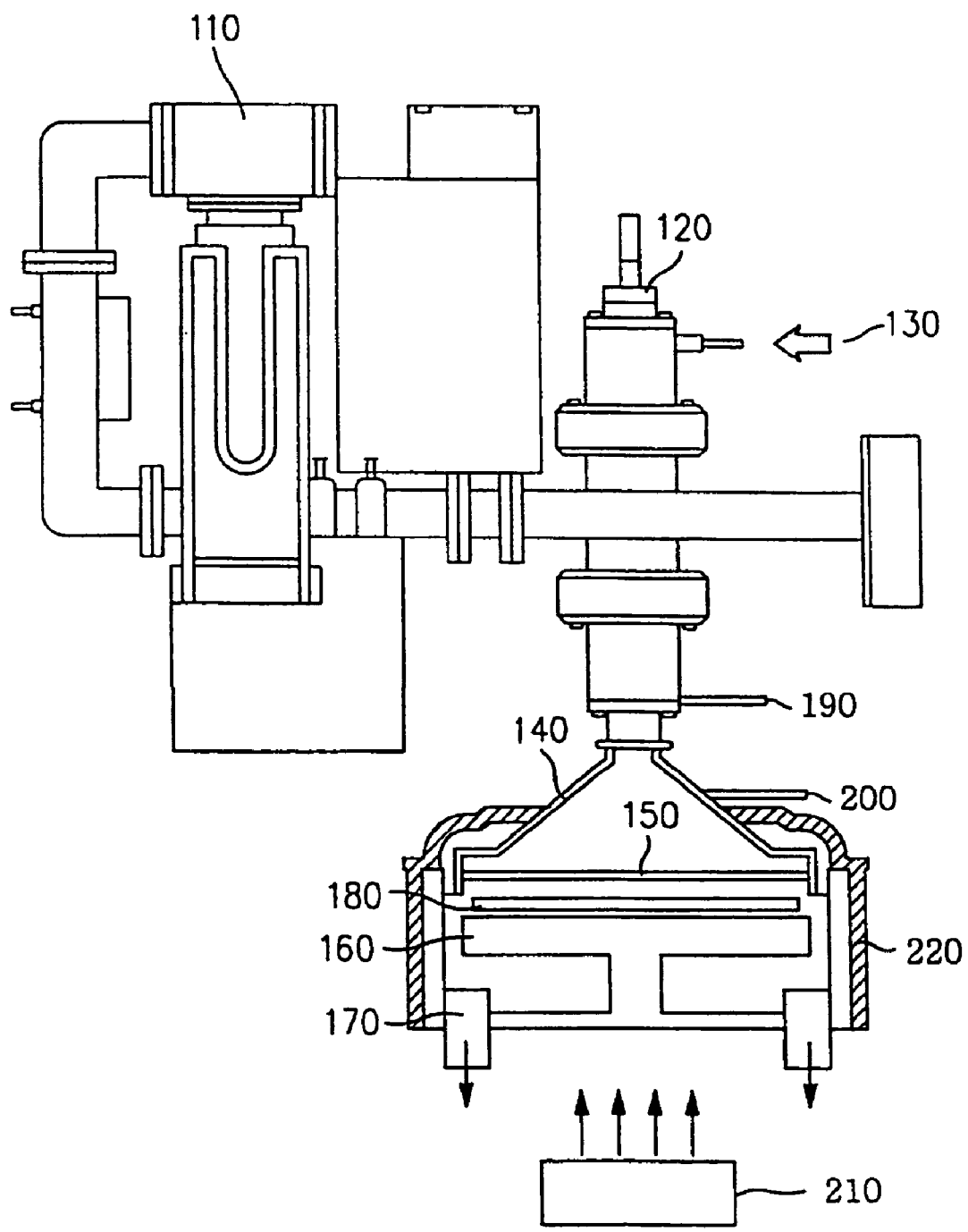
FIG. 3 is a schematic view of an embodiment of plasma etching apparatus according to the present invention.

FIG. 3 illustrates the structure of an embodiment of plasma etching apparatus according to the present invention. The plasma etching apparatus performs dry cleaning using a microwave plasma. Referring to FIG. 3, after a silicon substrate 180 is mounted on a substrate mount 160 under a chamber 140 that can be maintained in a vacuum state, a mixture gas of $N_2$ and $H_2$ is introduced through a first processing gas inlet 130. The mixture gas of $N_2$ and $H_2$ serves as a carrier gas for generating and maintaining plasma. Subsequently, plasma is generated by operating a microwave source module 110 and a plasma applicator 120 and HF gas is introduced through a second processing gas inlet 190. A fluorine-containing halogen compound, or a halogen compound such as HCl, $BCl_3$, or $ClF_3$ may be a substitute for HF. The plasma passes through a filter 150, while moving down toward the substrate 180. The filter 150, being a grounded baffle or grid, absorbs potential so that only radicals reach the silicon substrate 180. A heater 210 for annealing, where in the damaged portion of the silicon substrate surface is removed by annealing in a heat chamber.

A wall heat jacket 220 maintains the walls of the chamber 140 at an appropriate temperature to prevent the radicals from sticking to the walls of the chamber 140 and forming a byproduct layer and to concentrate the radicals on the surface of the silicon substrate for a high etch rate 180. H, O, N or F containing gas as a conditioning gas is introduced through a third processing gas inlet 200 to maintain the environment inside the chamber 140 constant and thus increase etch reproducibility after etching. The conditioning gas is H, F, O or N containing gas, or a mixture of the gases.

The used processing gases are exhausted through an outlet 170.

Figure 4:
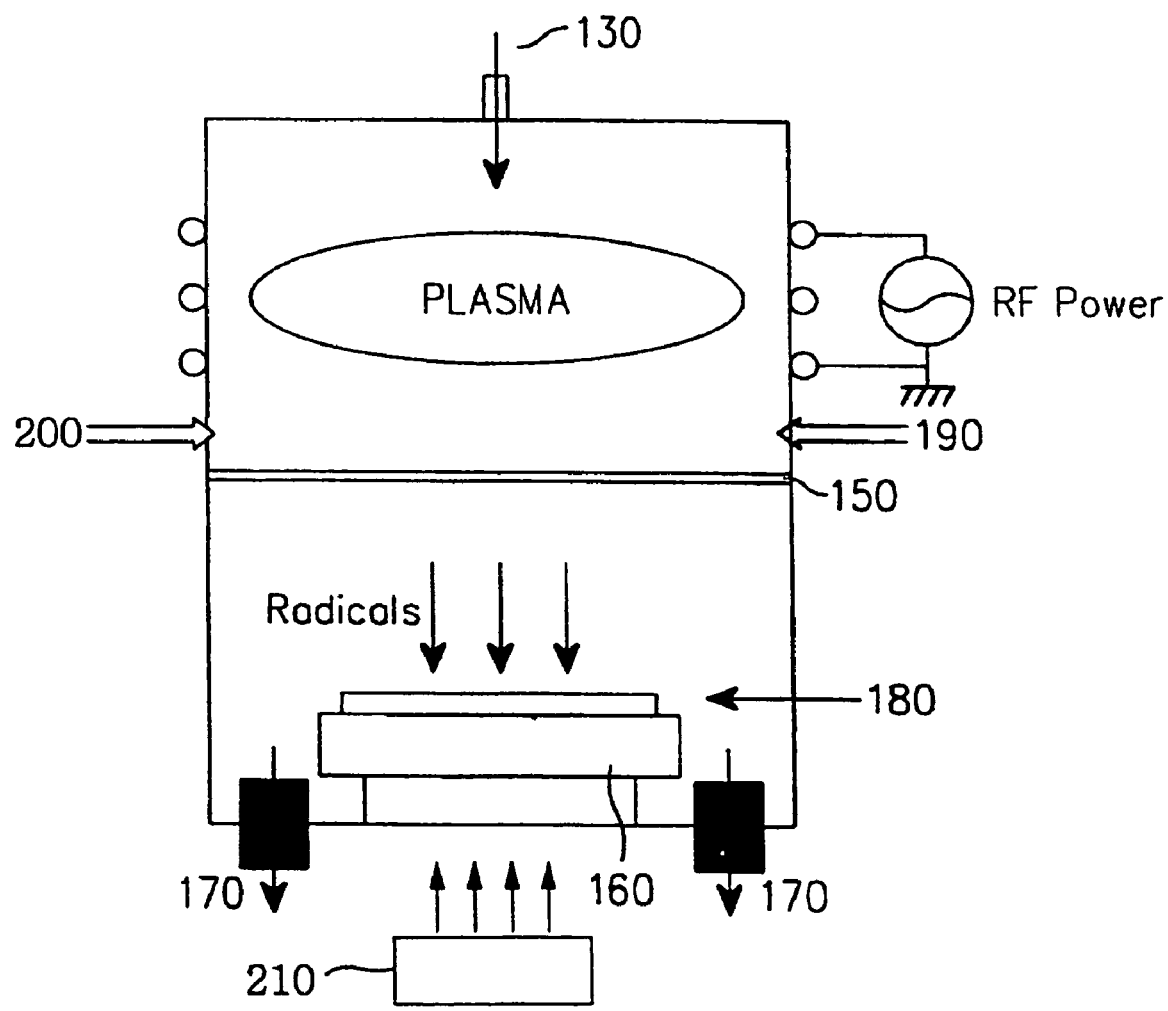
FIG. 4 is a schematic view of another embodiment of the plasma etching apparatus according to the present invention.

FIG. 4 illustrates the structure of another embodiment of the plasma etching apparatus according to the present invention. The plasma etching apparatus performs dry cleaning using a remote plasma. Referring to FIG. 4, this plasma etching apparatus is similar to the plasma etching apparatus using a microwave plasma except that RF power is supplied to generate plasma. The plasma etching apparatus is well known to those skilled in the field and thus its description is avoided here.

FIGS. 5A to 5E are sectional views sequentially illustrating a process of removing a native oxide layer and a damaged portion of a silicon substrate surface according to an embodiment of the present invention.

Figure 5A:
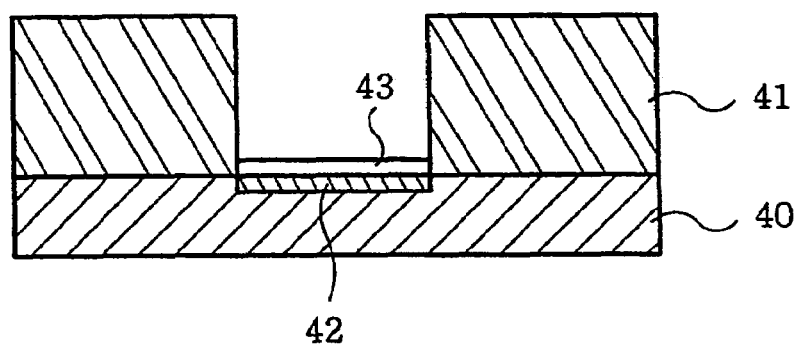
FIGS. 5A to 5E are sectional views sequentially illustrating an embodiment of a process of removing a native oxide layer and a damaged portion of a silicon substrate surface.

FIG. 5A illustrates the step of forming an interlayer insulation layer 41 on a silicon substrate 40 and then forming a contact hole by etching the interlayer insulation layer 41 in a contact area. The surface of the silicon substrate 40 exposed in the contact area is damaged during the etching. As a result, a damaged portion 42 and a native oxide layer 43 are sequentially formed on the silicon substrate 40. Since the native oxide layer 43 and the damaged portion 42 increase contact resistance or leakage current and as a result, deteriorates device characteristics, they must be removed.

Figure 5B:
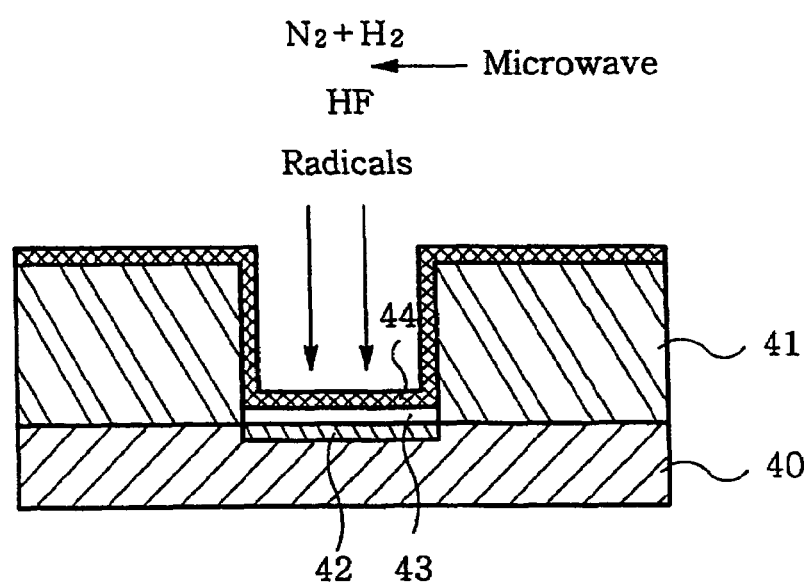

FIG. 5B illustrates the step of forming an NxHyFz polymer layer 44 or a byproduct on the native oxide layer 43, the interlayer insulation layer 41 and the sidewalls of a contact hole using plasma generated out of $H_2$ and $N_2$ gas, and HF gas as a second processing gas. By grounding a grid or baffle for filtering the plasma, or applying AC voltage, only radicals in the plasma reach the substrate surface.

Figure 5C:
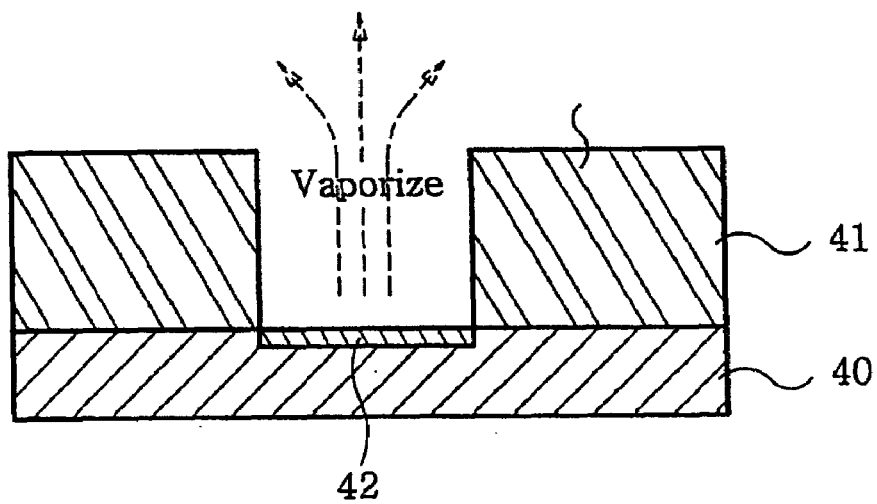

FIG. 5C illustrates the step of removing the polymer layer 44 by annealing. As the components of the polymer layer 44 are decomposed by annealing, the decomposed component are combined with the componentsof the underlying native oxide layer 43 to form $N_2O$, F, HF, $NH_3$, $SiF_4$, etc and then removed. Annealing temperature is between 120 and 400° C. Preferably, the annealing gas is at least one of $H_2$, $N_2$ or Ar. Particularly, annealing using $H_2$ gas terminates Si substrate surface. Instead of heat annealing, the polymer layer or byproduct can be removed by annealing using a UV lamp or IR (InfraRed) lamp radiation.

Figure 5D:
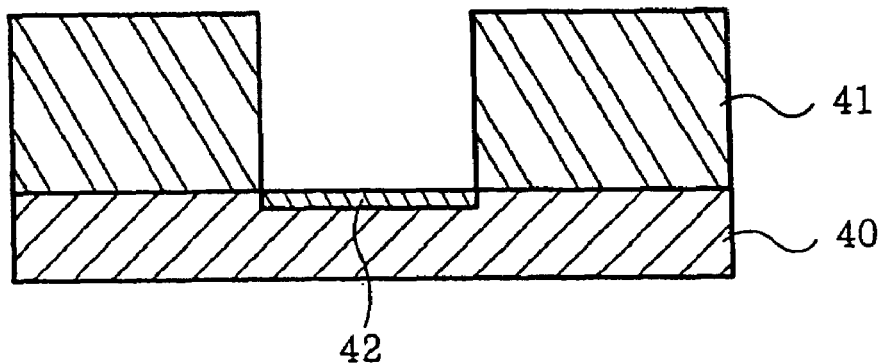

FIG. 5D illustrates the step of performing hydrophobic cleaning on the silicon substrate surface after the native oxide layer 43 is removed by annealing.

Figure 5E:
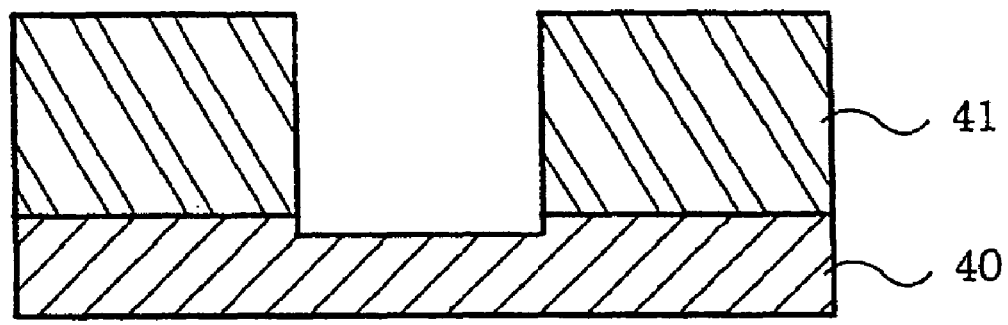

FIG. 5E illustrates the step of removing the silicon damaged portion 42 in-situ in the same chamber. The silicon damaged portion 42 can be removed using a remote plasma of at least one of $HF/H_2$, $HF/O_2$, $NF_3/O_2$, $SF^6/O_2$, and $CF_4/O_2$ or appropriately combining a gas such as $NF_3$, $CF_4$, and $C_2F_2$, a gas such as $O_2$, $CO_2$, $NO_2$, and $N_2$, and an inert gas such as He, Ne, Xe, and Ar. When removing the silicon damaged portion of a silicon substrate caused during processing including metal etching such as etching for formation of a metal contact window, it is more effective to use a remote plasma including Cl, like HCl, $ClF_3$ and so on.

A table shown below is a comparison between the present invention using HF as a second processing gas and the conventional technology using $NF_3$ as a second processing gas when a mixture gas of $H_2$ and $N_2$ is a first processing gas. As seen from the table, the present invention is much improved in etch rate (Å/min), silicon substrate roughness (RMS: nm), and metal contamination.

| Items | | HF | $NF_3$ | Reference |
|---|---|---|---|---|
| Etch Rate (Å/min) | | 42 | 30 | — |
| Selectivity of Oxide to Nitride (or Si-sub) | | >8 | >6 | — |
| SI Surface Roughness (RMS: nm) | | 0.2803 | 0.3623 | 0.1043 |
| Metal Contamination (/cm$^3$) | Al | 7.91E+10 | 4.38E+12 | 3.44E+09 |
| | Cr | 1.79E+09 | 5.36E+09 | 1.79E+09 |
| | Fe | 3.98E+10 | 1.43E+11 | 1.66E+09 |
| | Ni | 1.60E+09 | 9.61E+09 | 1.60E+09 |

Figure 6B:
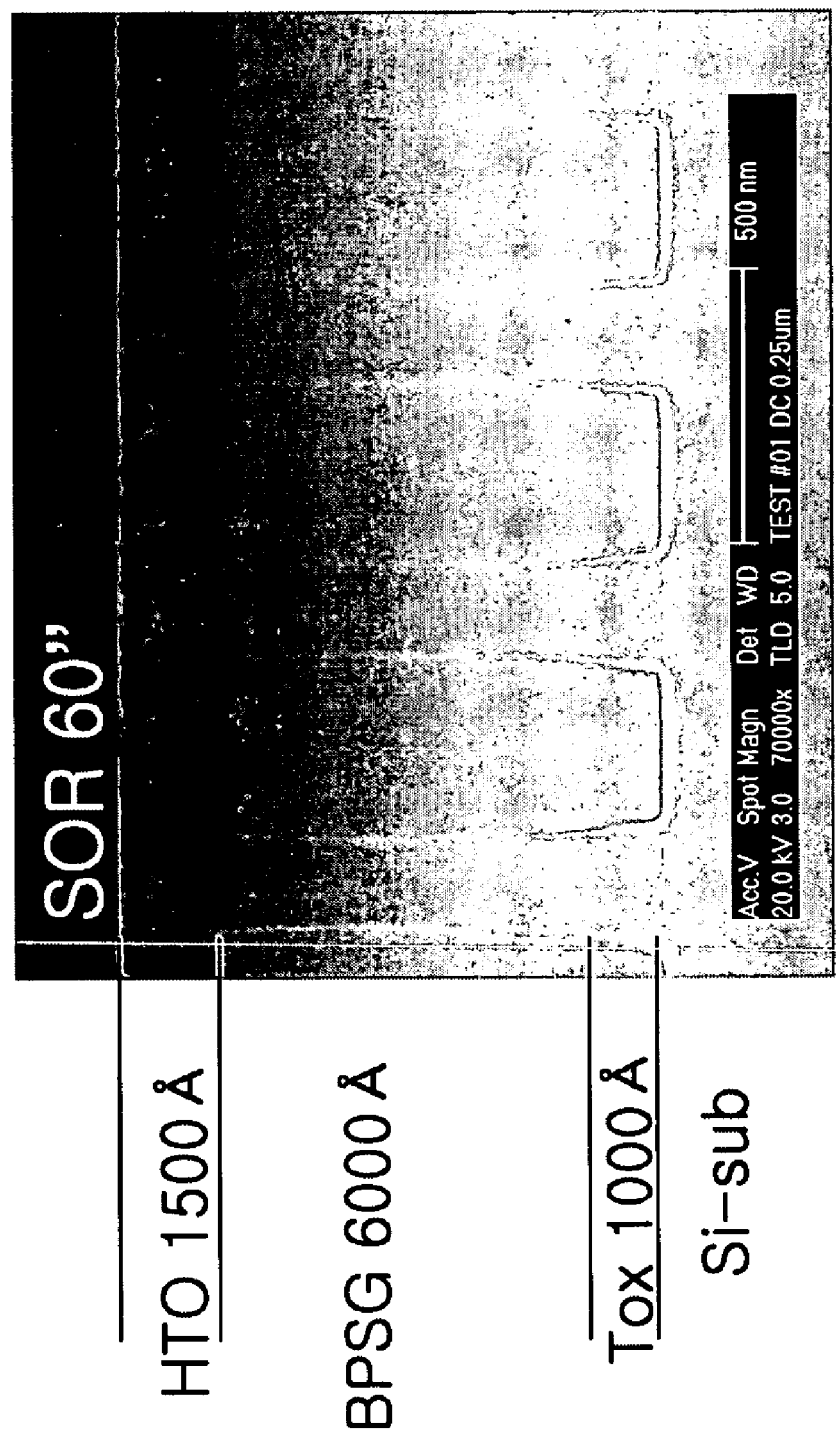

FIG. 6A illustrates a contact profile before removing a native oxide layer and FIG. 6B illustrates a contact profile during processing the native oxide layer for 60 seconds. There are little changes in the contact profiles in terms of CD and substrate damage.

Figure 7:
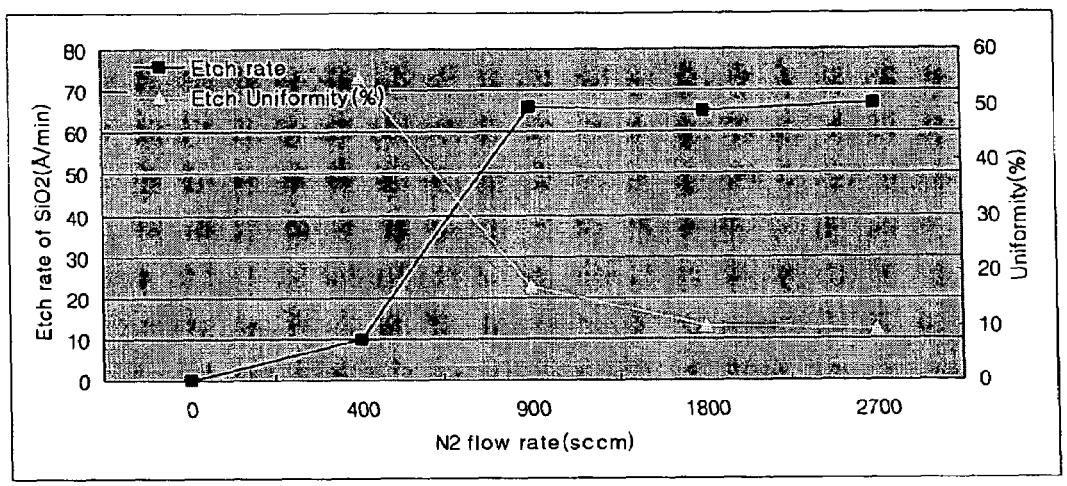
FIG. 7 is a graph illustrating etch rate and uniformity according to a $N_2$ flow rate at constant $H_2$ flow rate.

FIG. 7 is a graph illustrating etch rate and uniformity according to a $N_2$ flow rate at constant $H_2$ flow rate. Here, a gas pressure is 5 Torr and Microwave power is at 600 W and a flow rate of $H_2$ is 30 sccm(standard cubic centimeter per minute) and a flow rate of HF(second processing gas) is 48 sccm. If $N_2$ flow is zero, an etch rate of $SiO_2$ (Å/min) is negligible. An etch rate of $SiO_2$ (Å/min) increases as $N_2$ flow rate increases. After $N_2$ flow rate reaches 900 sccm, an etch rate is saturated. Similar trends can be found from pressure in the range of 0.1 Torr to 50 Torr, Microwave power in the range of 100 W to 2000 W, HF flow in the range of 5 sccm to 500 sccm. Uniformity improves as $N_2$ flow rate increases and at 1,800 sccm of $N_2$ flow rate it is about 10% with the current process kit.

Figure 8:
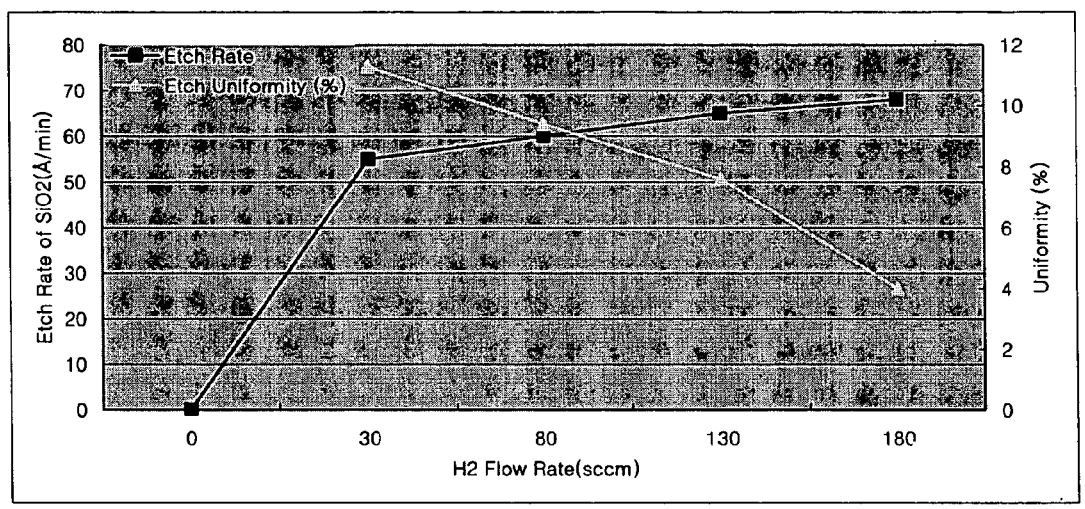
FIG. 8 is a graph illustrating etch rate and uniformity according to a $H_2$ flow rate at constant $N_2$ flow rate.

FIG. 8 is a graph illustrating etch rate and uniformity according to a $H_2$ flow rate at constant $N_2$ flow rate. Here, a gas pressure is 5 Torr and Microwave power is at 600 W and a flow rate of $N_2$ is 1,800 sccm(standard cubic centimeter per minute) and a flow rate of HF(second processing gas) is 48 sccm. If there is no $H_2$ flow, an etch rate of $SiO_2$ (Å/min) is negligible. An etch rate of $SiO_2$ (Å/min) increases as $N_2$ flow rate increases. Similar trends can be found from pressure in the range of 0.1 Torr to 50 Torr, Microwave power in the range of 100 W to 2000 W, HF flow in the range of 5 sccm to 500 sccm. Uniformity improves as $H_2$ flow rate increases with the current process kit.

Out of FIG. 7 and FIG. 8, it is found that in order to obtain greater than 50 (Å/min) etch rate of $SiO_2$ a combination of at least 500 sccm flow rate of $N_2$ and at least a 20 sccm flow rate of $H_2$ is preferable.

Particularly, surface cleaning speed 2–3 times more than normal cleaning environments is acquired by maintaining chamber wall temperature between 50° C. and 120° C. during whole cleaning process including a step of plasma generating, polymer forming and annealing. Maintaining the chamber wall temperature between 50° C. and 120° C. during whole cleaning process also prevents the formation of contaminant particles on wall.

In accordance with the present invention as described above, (1) deterioration of the characteristics of a gate oxide layer is prevented by removing a native oxide layer or a chemical oxide layer formed on a silicon surface before growth of the gate oxide layer; (2) the increase of contact resistance and leakage at a contact are prevented by removing a native oxide layer or a chemical oxide layer formed on a silicon surface exposed after etching for a contact hole and a portion of the silicon surface damaged during etching; (3) metal contact resistance is reduced by removing organic contaminants such as polymers existing at the boundary between the sidewalls of a contact and an underlying metal during etching the metal contact hole; (4) good quality epitaxial silicon is grown by removing a native oxide layer or a chemical oxide layer from a silicon surface in an epitaxial silicon growing process; (5) good quality HSGs are grown by removing a native oxide layer or a chemical oxide layer from a silicon surface in an HSG silicon forming process; and (6) process uniformity is improved by introducing a conditioning gas after processing each wafer and thus maintaining the environment of a chamber constant.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A surface cleaning method using plasma for fabrication of an integrated circuit in a surface cleaning apparatus having a chamber that can be maintained in a vacuum state, a substrate mount for mounting a substrate, a first processing gas inlet for introducing a carrier gas for generation and maintenance of plasma, a plasma generator, a filter for passing only radicals to said substrate, and a second processing gas inlet, the method comprising the steps of:

forming a polymer layer of NxHyFz on a natural oxide layer on said substrate during patterning step wherein forming said polymer layer comprises the steps of generating a plasma by introducing a first processing gas of $H_2$ and $N_2$ mixture into said first processing gas inlet and introducing a second processing HF gas into said second processing gas inlet into said plasma; and removing said polymer layer and said natural oxide layer by annealing wherein components of said polymer layer are decomposed and combined with the components of said natural oxide layer and removed, further comprising a step of filtering said plasma to pass only radicals after said step of generating said plasma by introducing said first processing gas of $H_2$ and $N_2$ mixture and said step of introducing said second processing HF gas into said plasma.

2. The method of claim 1, further comprising a step of removing a damaged portion of the surface of said substrate after said step of removing said polymer layer and said natural oxide layer by annealing with a flow of $H_2$.

3. The method of claim 1, wherein wall temperature of said cleaning apparatus is maintained at between 50° C. and 120° C. during whole process of said cleaning said surface of said substrate.

4. The method of claim 1, wherein a flow rate of said $H_2$ gas is above 180 sccm and a flow rate of $N_2$ gas is above 1,800 sccm when a gas pressure is 5 Torr and microwave power is at 600 W and a flow rate of HF gas is 48 sccm.

* * * * *